United States Patent
Peng et al.

(10) Patent No.: US 6,939,199 B2
(45) Date of Patent: Sep. 6, 2005

(54) METHOD AND APPARATUS FOR CUTTING SEMICONDUCTOR WAFERS

(75) Inventors: Neo Chee Peng, Singapore (SG); Tan Hock Chuan, Singapore (SG); Ho Kian Seng, Singapore (SG); Chew Beng Chye, Singapore (SG); Lim Guek Har, Sinagapore (SG); Tan Kok Chua, Singapore (SG)

(73) Assignee: Micron Technology, Inc., Boise, ID (US)

( * ) Notice: Subject to any disclaimer, the term of this patent is extended or adjusted under 35 U.S.C. 154(b) by 37 days.

(21) Appl. No.: 10/453,765

(22) Filed: Jun. 2, 2003

(65) Prior Publication Data

US 2003/0203538 A1 Oct. 30, 2003

Related U.S. Application Data

(62) Division of application No. 09/944,281, filed on Aug. 30, 2001, now Pat. No. 6,576,531.

(30) Foreign Application Priority Data

Aug. 24, 2001 (SG) ..................................... 200105173-9

(51) Int. Cl.⁷ ................................................. B24B 1/00
(52) U.S. Cl. ...................... 451/5; 451/6; 451/8; 451/9; 125/13.01; 83/62; 83/62.1
(58) Field of Search ................................ 451/5, 6, 8, 9; 125/12, 13.01; 408/5, 6, 8, 9, 11; 409/134; 83/62, 62.1, 522.27; 73/7, 104; 340/680

(56) References Cited

U.S. PATENT DOCUMENTS

| | | |
|---|---|---|
| 4,355,555 A * | 10/1982 | Kobayashi et al. .......... 83/62.1 |
| 4,498,345 A | 2/1985 | Dyer et al. |
| 4,501,258 A | 2/1985 | Dyer et al. |
| 4,502,459 A | 3/1985 | Dyer |
| 4,971,021 A | 11/1990 | Kubotera et al. |
| 5,025,593 A * | 6/1991 | Kawaguchi et al. .......... 451/11 |
| 5,031,360 A * | 7/1991 | Farnworth et al. ............. 451/6 |
| 5,163,334 A | 11/1992 | Li et al. |
| 5,433,649 A * | 7/1995 | Nishida ......................... 451/5 |
| 5,573,442 A | 11/1996 | Morita et al. |
| 5,632,666 A | 5/1997 | Peratello et al. |
| 5,668,061 A | 9/1997 | Herko et al. |
| 5,681,204 A | 10/1997 | Kawaguchi et al. |
| 5,718,615 A * | 2/1998 | Boucher et al. ............... 451/5 |
| 5,934,973 A | 8/1999 | Boucher et al. |
| 6,006,739 A | 12/1999 | Akram et al. |
| 6,152,803 A | 11/2000 | Boucher et al. |
| 6,732,612 B2 * | 5/2004 | Adachi et al. .................. 81/13 |
| 6,871,416 B2 * | 3/2005 | Leja et al. .................... 33/550 |

* cited by examiner

*Primary Examiner*—George Nguyen
(74) *Attorney, Agent, or Firm*—Perkins Coie LLP

(57) ABSTRACT

Improperly mounted wafer saw blades can damage wafers cut or diced with the blades. Embodiments of this invention employ sensors to measure a distance to the blade to help indicate if the blade is improperly mounted. In one method of the invention, a the distance to the blade face is measured as the blade is rotated and a variance in this measured distance is determined. If the variance is no greater than a predetermined maximum, the blade may be used to cut the wafer. In one apparatus of the invention, a wafer saw include a blade and a sensor. The sensor is adapted to monitor a distance to a face of the rotating blade. A processor coupled to the sensor may indicate if the distance to the face of the blade as it rotates deviates too far from a baseline position of the blade face.

36 Claims, 5 Drawing Sheets

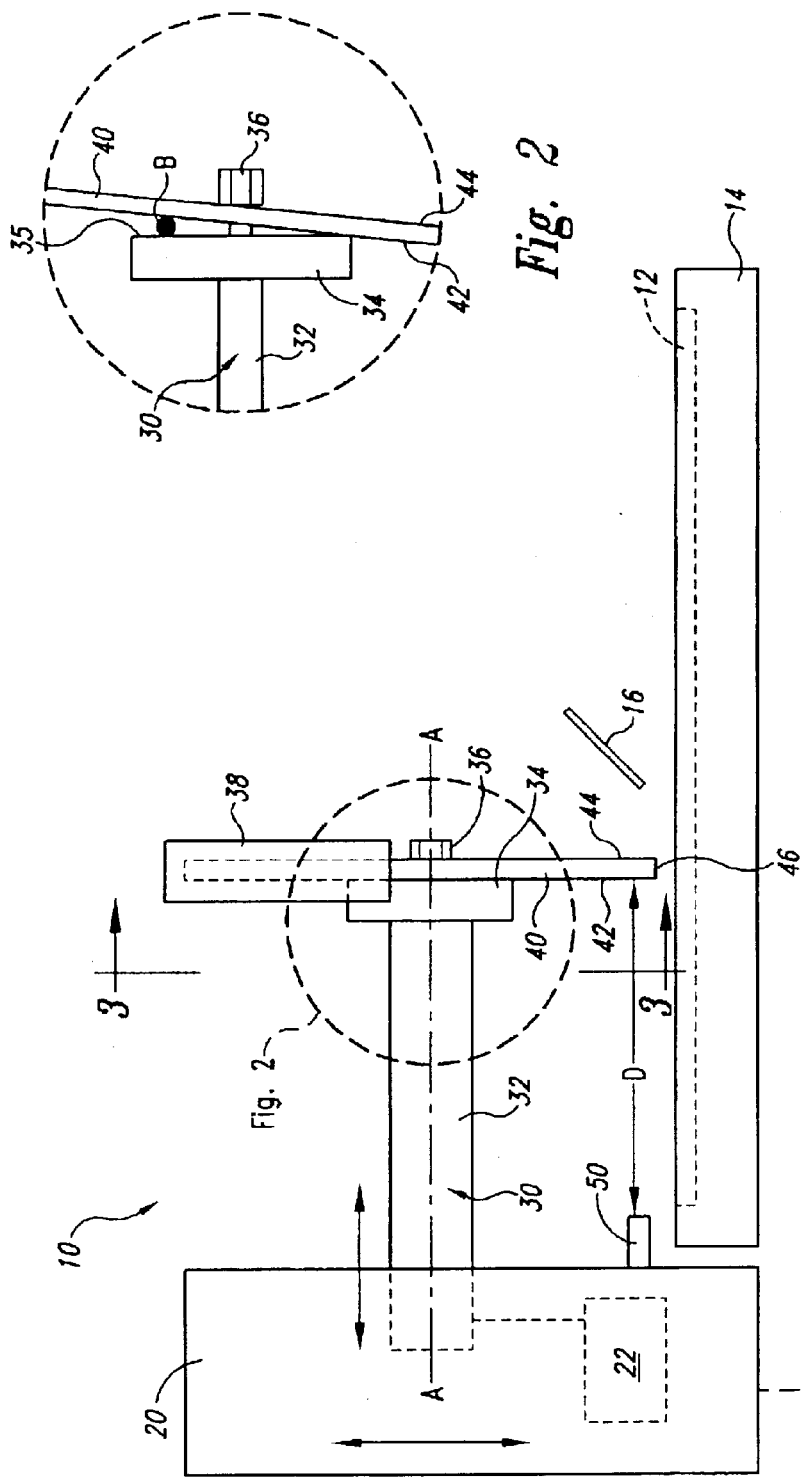

METHOD AND APPARATUS FOR CUTTING SEMICONDUCTOR WAFERS

This application is a divisional of U.S. patent application Ser. No. 09/944,281, filed on Aug. 30, 2001, now U.S. Pat. No. 6,576,531. issued Jun. 10, 2003, which claims foreign priority benefits of Singapore Application No. 200105173-9 filed on Aug. 24, 2001.

TECHNICAL FIELD

The present invention generally relates to devices and methods for cutting microelectronic devices, such as in dicing semiconductor wafers into individual dies.

BACKGROUND

An individual microelectronic component or die is usually formed from a larger substrate, typically a semiconductor wafer. Wafers most commonly are formed primarily from silicon, although other materials such as gallium arsenide and indium phosphide are also sometimes used. Semiconductor wafers have a plurality of dies arranged in rows and columns. Typically, the wafer is sawed or "diced" into discrete dies by cutting the wafer along mutually perpendicular sets of parallel lines or "streets" lying between the rows and columns.

In a typical dicing operation, a semiconductor wafer is attached to a carrier, such as by use of an adhesive, and the carrier is mounted on a table of wafer saw. The wafer saw includes a rotating dicing blade which is attached to a rotating spindle. The dicing blade has a peripheral cutting edge which may be coated with diamond particles or other abrasives to assist in cutting the semiconductor wafer. As the blade of the wafer saw is rotated, it cuts at least partially through the thickness of the wafer and is carefully guided along the streets between adjacent dies. The blade may be guided along these streets by moving the blade relative to the wafer, by moving the table of and the wafer relative to the blade, or by moving both the table and the blade.

If a blade is not precisely mounted on the spindle, the peripheral edge of the rotating blade can trace an irregular path with respect to the axis of rotation of the spindle. Commonly, a blade will be mounted with a flat blade surface clamped flush against a flat surface of a mounting hub carried by the spindle. If the blade is not properly clamped against the hub, any play in the attachment of the blade to the spindle may cause the peripheral cutting edge of the blade to oscillate or waver irregularly. Sometimes a foreign particle can become wedged between the mounting hub and the face of the blade or the mounting hub or the blade may have a burr on its surface. Such a foreign particle or burr can cause the blade to be mounted at an angle. As the shaft is rotated, the path scribed by the peripheral cutting edge of the blade will wobble.

Wavering of the blade as the shaft is rotated can cause the blade to deviate outside the intended street on the wafer, damaging dies on one or both sides of the street. Semiconductor wafers also tend to be somewhat brittle. A wavering blade can cause chipping of the surface of the wafer, damaging dies adjacent to the street even if the blade stays within the proscribed width of the street.

The difficulties associated with properly mounting dicing blades is increasing as the semiconductor industry moves toward dual-blade wafer saws. There are two varieties of dual-blade wafer saws on the market today—dual spindle saws (with parallel, side-by-side spindles) and twin spindle saws (with opposed, axially aligned spindles). One such twin spindle wafer saw is shown in FIG. 3 of U.S. Pat. No. 6,006,739, the entirety of which is incorporated herein by reference. Typically, such twin spindle dual-blade wafer saws simultaneously cut the surface of the semiconductor wafer along parallel lines using a pair of parallel dicing blades. The two blades typically have the same diameter and are rotated about a common rotation axis so they will cut the wafer to the same depth. With commercially available dual-blade wafer saws, the operator's access to the area where the blades are mounted is somewhat limited. It is often difficult for the operator to view the blades edge-on and the operator frequently must mount blades looking along or parallel to the axis of rotation. This makes it difficult for the operator to see the mounting hubs to which the blades are being attached, leading to errors in mounting the blades. In addition, it is difficult to visually confirm that both blades are properly mounted. A highly-skilled, experienced operator can sometimes observe unacceptable wobbling of a cutting blade by watching the blade as it rotates. This visual observation is made more difficult if the operator is only able to watch a face of the blade instead of the edge of the blade. In dual-blade saws, an operator's view of the front blade is largely limited to watching the face of the rotating blade and view of the rear blade is usually greatly hindered, if not completely blocked, by superimposition of the front blade between the operator and the rear blade.

SUMMARY

Embodiments of the present invention provide methods useful in cutting a semiconductor substrate, e.g., a semiconductor wafer, and semiconductor wafer saws. One embodiment of the invention provides a method for cutting a semiconductor substrate wherein the semiconductor substrate is positioned with respect to a blade of a saw. The blade is rotated in a first spaced position wherein a peripheral cutting edge of the blade is spaced from the semiconductor substrate. A distance to a face of the blade is measured as the blade is rotated in the first spaced position. A first variance in the measured distance is determined as the blade is rotated. If the first variance is no greater than a predetermined maximum variance, the semiconductor substrate is contacted with the peripheral cutting edge of the blade. The blade may be translated with respect to the semiconductor substrate to cut at least partially through the semiconductor substrate. If so desired, the method may further include terminating rotation of the blade if the first variance is greater than the predetermined maximum variance. One adaptation of this embodiment includes positioning the blade in a second spaced position after cutting the semiconductor substrate. The peripheral cutting edge of the blade is spaced from the substrate when the blade is in the second spaced position. The blade is rotated in the second spaced position without cutting the semiconductor substrate, the distance to the face of the blade is measured as the blade is rotated in the second spaced position, and a second variance is determined.

Another embodiment of the invention provides a method of operating a semiconductor substrate saw which includes rotating a blade of the saw without contacting the blade with a flow of liquid. A distance to a face of the blade is monitored as the blade rotates. A first baseline distance to the face of the blade and a first deviation from the baseline distance are determined. An error is indicated if the first deviation is greater than a predetermined maximum deviation. Only if the error is not indicated, a first cut at least partially through a semiconductor substrate is made with the blade while contacting the blade with a flow of liquid, such as a cooling liquid.

A method of exchanging a blade of a semiconductor substrate saw is provided in accordance with another embodiment of the invention. In this method, a used blade is removed from a blade mount carried on a shaft of the saw. A new blade is mounted on the blade mount and the new blade is rotated prior to contacting a semiconductor substrate with the new blade. Prior to contacting the semiconductor substrate with the new blade, a distance to a face of the new blade is monitored as the blade rotates, a baseline distance to the face of the blade and a deviation from the baseline distance are determined, and an error is indicated if the deviation exceeds a predetermined maximum deviation. Only if the error is not indicated, a cut is made at least partially through the semiconductor substrate with the blade.

Another embodiment provides a method of exchanging a blade of a multiple-blade saw which includes a used first blade and a second blade, which may also be a used blade. The used first blade is carried on a first shaft for rotation with the first shaft and the second blade is carried on a second shaft for rotation with the second shaft. The used first blade is removed from the first blade mount and a new first blade is mounted on the first blade mount. The new first blade is rotated in a first position and a distance from a first sensor to a face of the new first blade is monitored as the new first blade rotates in the first position. The first sensor is associated with the second shaft. An indication is made whether a first variance in the monitored distance as the new first blade is rotated exceeds a predetermined maximum first variance. If the first variance is not greater than the maximum first variance, a semiconductor substrate may be contacted with the new first blade and with the second blade. This method may further comprise moving the second shaft and the first sensor laterally with respect to the first shaft, thereby changing the distance from the first sensor to the face of the new first blade.

Another embodiment of the invention provides a semiconductor wafer saw. The saw includes a carrier for a microelectronic workpiece and a driver. A first shaft is coupled to the driver and extends opposite the carrier. The first shaft has a first axis. A first blade mount is carried adjacent an end of the shaft for rotation with the first shaft and a first blade is carried by the first blade mount for rotation with the first blade mount. The first blade has a face and peripheral cutting edge. A sensor is spaced from the first blade and is oriented toward the face of the first blade. The sensor maintains a fixed angular position with respect to the first axis as the first blade is rotated with the shaft and is adapted to measure a distance to the face of the first blade. A processor is operatively coupled to the sensor. The processor is adapted to indicate if the distance to the face of the first blade deviates more than a predetermined permitted deviation from a baseline distance to the face of the first blade as the blade rotates.

Yet another embodiment of the invention provides an alternative semiconductor wafer saw which includes multiple blades. In particular, this wafer saw includes a carrier for a microelectronic workpiece. A first spindle extends opposite the carrier and has a first axis. A first blade is carried by the first spindle for rotation therewith and the first blade has a face and a peripheral cutting edge. A second spindle extends opposite the carrier and has a second axis. A second blade is carried by the second spindle for rotation therewith and the second blade has a face and a peripheral cutting edge. A first sensor is carried by the second spindle and adapted to measured a first distance to the face of the first blade. The first sensor maintains a fixed angular position with respect to the first axis as the first blade rotates about the first axis. A second sensor is carried by the first spindle and is adapted to measure a second distance to the face of the second blade. The second sensor maintains a fixed angular position with respect to the second axis as the second blade rotates about the second axis. A processor is operatively coupled to the first and second sensors. The processor is adapted to indicate if variation of the first distance as the first blade rotates exceeds a predetermined maximum first variation and to indicate if variation of the second distance as the second blade rotates exceed a predetermined maximum second variation.

BRIEF DESCRIPTION OF THE DRAWINGS

FIG. 1 is schematic side view of a semiconductor substrate saw in accordance with one embodiment of the invention.

FIG. 2 is a schematic isolation view of the encircled portion of FIG. 1.

DETAILED DESCRIPTION

Figure 3:
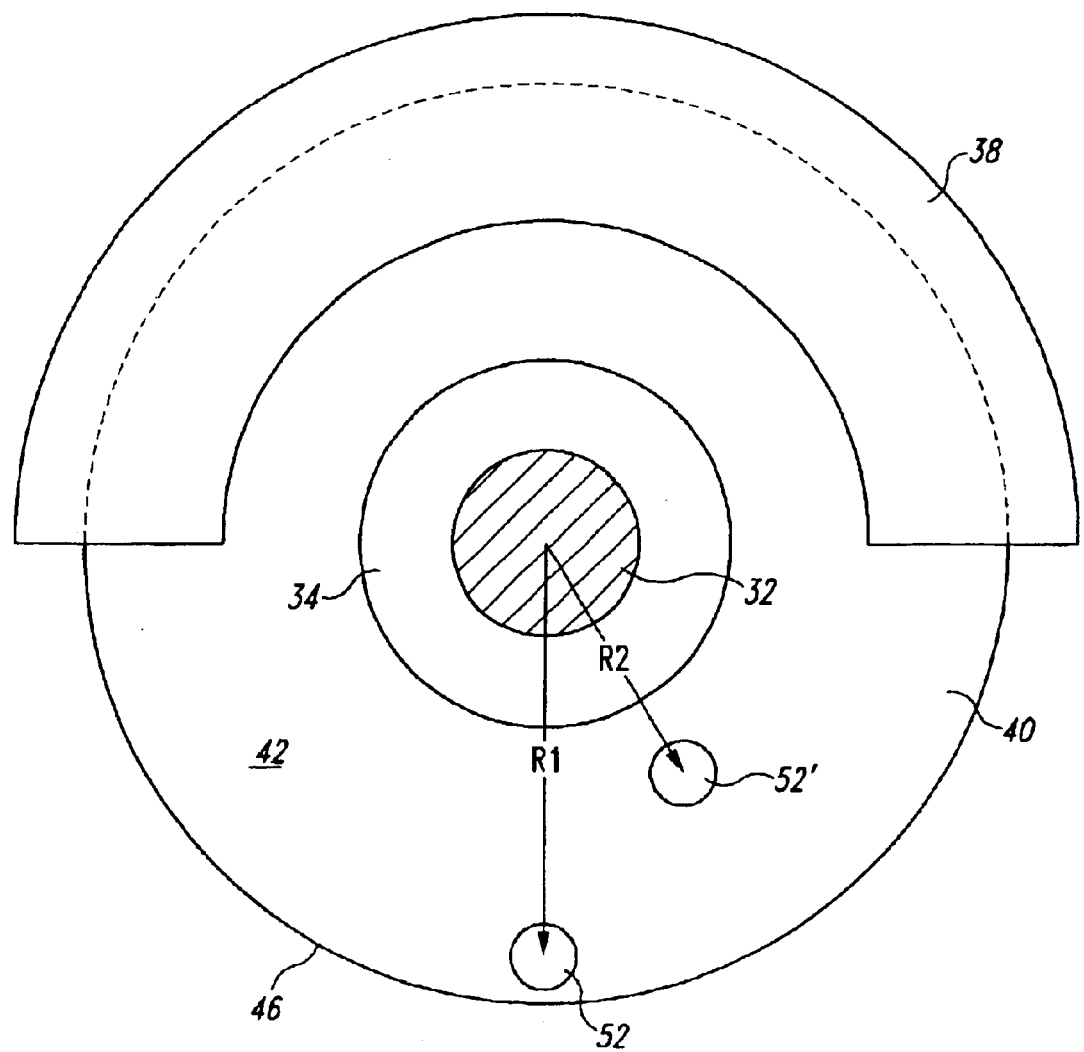
FIG. 3 is a schematic elevation view taken along line 3—3 in FIG. 1.

Various embodiments of the present invention provide semiconductor substrate saws and methods for operating such saws to cut semiconductor substrates. The following description provides specific details of certain embodiments of the invention illustrated in the drawings to provide a thorough understanding of those embodiments. It should be recognized, however, that the present invention can be reflected in additional embodiments and the invention may be practiced without some of the details in the following description.

Single Blade Saw

FIG. 1 schematically illustrates a semiconductor substrate saw 10 in accordance with one embodiment of the invention. This saw 10 includes a wafer table 14 which can be used to support a wafer 12. In one embodiment of the invention, the wafer table 14 is rotatable and translatable in a fixed horizontal plane. Such wafer tables and mechanisms for controlling their movement are well known in the art and need not be discussed in detail here.

The saw 10 may also include a support 20 which is positioned adjacent the wafer table 14. The support 20 can take any desired form. In FIG. 1 the support 20 is schematically shown as an upright structure extending vertically from a position adjacent the table 14, but any structure which properly positions the blade 40 with respect to the wafer 12 will suffice. The support 20 in FIG. 1 is shown as enclosing a driver 22. The driver 22 is operatively coupled to a spindle 30 to rotate the spindle 30 about its rotational axis A—A. Any suitable driver 22 may be employed. In one embodiment, the driver 22 is an electric motor which can be electronically controlled by a processor 60.

The spindle 30 may be carried by the support 20 in any desired fashion. In certain embodiments, the spindle 30 is movable with respect to the support along one or more axes. In one such embodiment, the spindle 30 is adapted to move toward the wafer table 14 and away from the wafer table 14 under control of the processor 60. For the wafer saw 10 of FIG. 1 wherein the wafer table 14 is generally horizontal, this motion of the spindle 30 may comprise substantially vertical movement. The spindle 30 may also be adapted to extend outwardly from and retract inwardly toward the support 20, such as by moving laterally generally along the rotational axis A—A of the spindle 30. In the illustrated embodiment, the rotational axis A—A is substantially parallel to the horizontal plane of the wafer table 14 and the spindle moves horizontally along this axis A—A.

Any suitable spindle 30 may be employed. In one embodiment, the spindle 30 comprises a shaft 32 which may be coupled to the driver 22. A mounting hub 34 having a mounting face 35 may be carried adjacent an end of the shaft 32 spaced away from the support 20. The mounting face 35 should be substantially planar and may be polished to a smooth finish. The mounting face 35 of the mounting hub 34 should have a known orientation with respect to the rotational axis A—A of the spindle 30. Preferably, the face 35 is substantially perpendicular to the rotational axis A—A.

The spindle 30 may include a mounting mechanism for firmly mounting a blade 40 against the mounting hub 34. This mounting mechanism may take any suitable form. In FIGS. 1 and 2, the mounting mechanism is schematically illustrated as a retaining nut 36. The retaining nut 36 or other mounting mechanism is adapted to releasably retain a blade 40 on the spindle 30. The retaining nut may engage an outer face 44 of the blade 40 and tightly clamp a mounting face 42 of the blade 40 against the mounting face 35 of the mounting hub 34. In ordinary operation, the portion of the mounting face 42 of the blade 40 covered by the mounting hub 34 will have a smooth, flat surface which is adapted to mate flush against the mounting face 35 of the mounting hub 34.

Any conventional semiconductor substrate cutting blade may be used as the blade 40. As noted previously, many such cutting blades include a peripheral edge 46 adapted to cut the wafer 12 or other semiconductor substrate. A wide variety of such blades 40 are commercially available.

In operating a conventional wafer saw, the blade 40 and the wafer 12 are contacted with a flow of a cooling liquid, such as deionized water, to minimize damage to the wafer 12 due to localized overheating. In the saw 10 of FIG. 1, this flow of water or other cooling liquid may be delivered through a water line 16. To prevent the water from spraying as the blade rotates and to help protect the blade from inadvertent damage during rotation, a shroud 38 may be provided over an upper portion of the blade 40. The shroud may take any desired form. In the illustrated embodiment, the shroud covers an outer peripheral portion of the blade 40. The location of the shroud 38 should be selected to avoid any interference in measurement of the distance D by the sensor 50, discussed below.

If the blade 40 is properly mounted on the spindle 30, the mounting face 42 of the blade 40 should rotate in a plane which is substantially perpendicular to the rotational axis A—A of the spindle 30. If the blade 40 is not properly clamped between the retaining nut 36 and the mounting hub 34, however, the blade 40 may shift slightly as it cuts the wafer 12. This can lead to somewhat erratic movement of the peripheral cutting edge 46 of the blade 40, risking damage to the wafer 12, as noted above.

FIG. 2 schematically illustrates another problem which may be encountered in mounting the blade 40 on the spindle 30. In FIG. 2, a burr B extends outwardly from the mounting face 35 of the mounting hub 34 and abuts the mounting face 42 of the blade 40. (It should be understood that FIG. 2 is not drawn to scale and the size of the burr B has been exaggerated for purposes of illustration.) Such a burr B may arise due to inadvertent damage to the mounting face 35 of the mounting hub 34 or to the blade 40. As shown in FIG. 2, the burr B prevents the mounting face 42 of the blade 40 from lying flush against the mounting face 35 of the mounting hub 34. As a consequence, the blade 40 is not oriented perpendicular to the rotational axis (A—A in FIG. 1) of the spindle 30. As a consequence, the point of contact between the peripheral cutting edge 46 and the wafer 12 will shift from side to side as the blade 40 is rotated. This can chip or otherwise damage the wafer 12 being diced. While FIG. 2 schematically illustrates a burr B between the mounting hub 34 and the blade 40, much the same situation can arise if some foreign article becomes trapped between the blade 40 and the mounting hub 34 as the blade 40 is mounted on the spindle 30.

The saw 10 of FIG. 1 also includes a sensor 50 which is adapted to measure a distance of the blade 40 as the blade 40 rotates about the rotational axis A—A. In one embodiment, the sensor 50 is adapted to measure the distance from the sensor 50 to the mounting face 42 of the blade 40 without any direct physical contact with the blade 40. This may be accomplished, for example, by directing a beam of radiation at the blade 40 and measuring the reflection of that radiation by the blade mounting face 42. Any of a variety of non-contact distance measurement devices can be employed as the sensor 50 if they are suitably sensitive. In one useful embodiment of the invention, the sensor 50 comprises a CCD laser displacement sensor, such as a LK-2500 series sensor available from Keyence Corporation, Osaka, Japan.

The support 50 is adapted to maintain a fixed angular relationship with respect to the rotational axis A—A of the spindle 30 as the spindle 30 rotates about that axis A—A. In the embodiment of FIG. 1, the sensor 50 is shown as being carried by the support 20. While this ensures that the angular relationship between the sensor 50 and the rotational axis A—A remains fixed, it should be noted that the distance between the sensor 50 and the blade mounting face 42 will vary over time, even if the blade is ideally mounted on the hub 34, as the spindle 30 is translated inwardly and outwardly with respect to the support 20 along the rotational axis A—A.

The sensor 50 is adapted to monitor the distance D from the sensor 50 to the blade mounting face 42. In one embodiment of the invention, the sensor 50 monitors the distance D during the entire operation of the saw 10 as it cuts the wafer 12. Cooling water on the blade mounting face 42 can interfere with accurate readings of the distance D in some embodiments, though. In an alternative embodiment, the sensor 50 measures the distance D to the mounting face 42 only at selected times, as described below.

Figure 4:
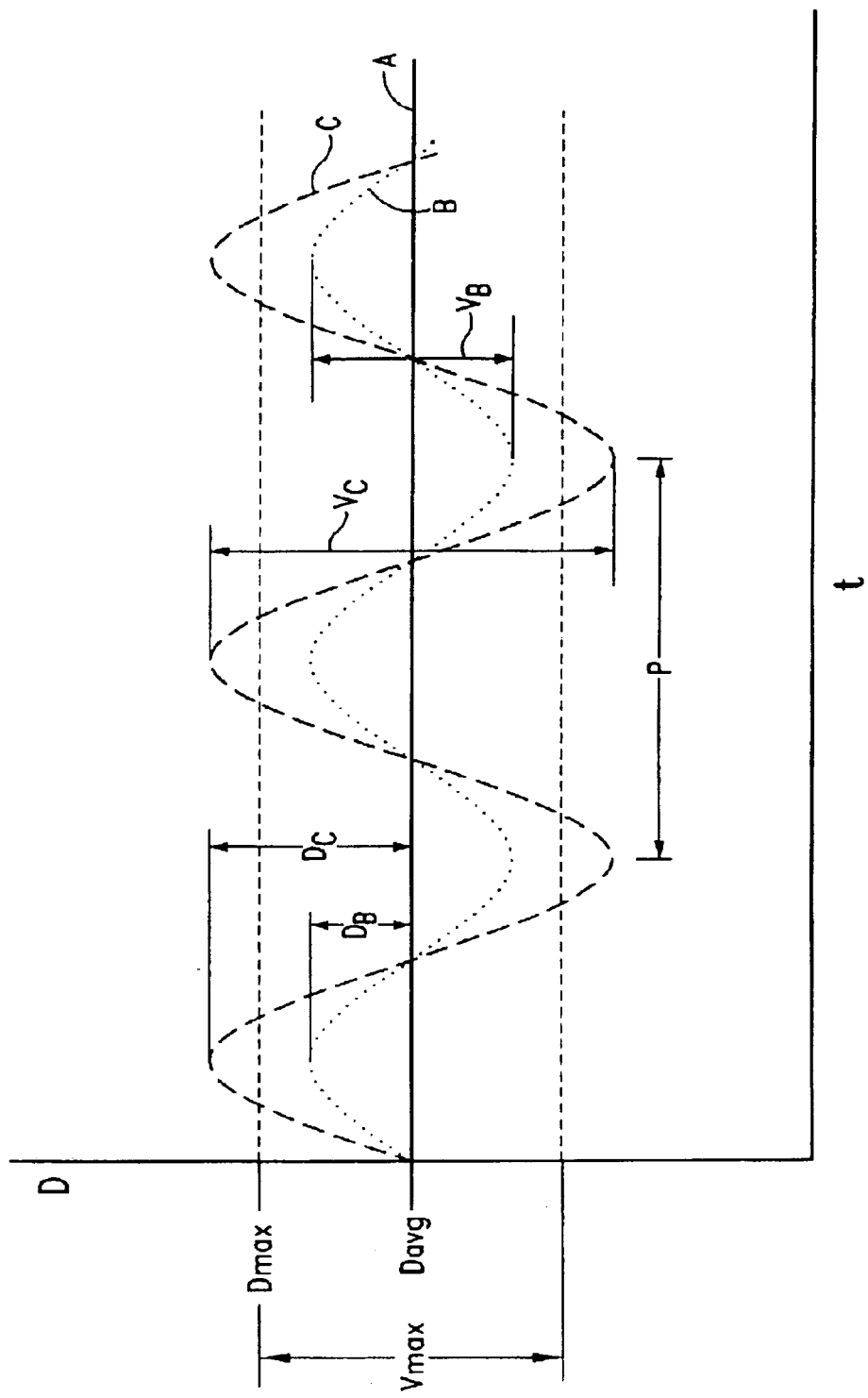
FIG. 4 is a graph schematically illustrating output of the sensor of FIG. 1.

FIG. 4 schematically illustrates three idealized plots of the distance D between the sensor 50 and the blade mounting face 42 for three different circumstances. In an idealized condition wherein the blade mounting face 42 is perfectly flat and the blade 40 is perfectly mounted on the mounting hub 34, the distance D will not vary at all as the blade 40 is rotated unless the spindle 30 is translated along the rotational axis A—A. This idealized circumstance is represented by a straight line A in FIG. 4. The dashed curve C in FIG. 4 illustrates a plot of the distance D as a function of time t for an improperly mounted blade 40, such as the blade 40 shown in FIG. 2. This curve C is generally sinusoidal, with a period P which represents one complete revolution of the blade 40 about the rotational axis A—A. During the course of each period P, the distance D varies from a maximum reading to a minimum reading. This variation in the distance D may be considered a variance $V_c$ for the curve C. The average distance $D_{avg}$ of the curve C may be thought of as a baseline distance from the sensor 50 to the blade mounting face 42. The actual distance D will vary about this baseline distance $D_{avg}$, as the blade rotates, with the maximum change from this baseline distance being a deviation $D_c$ for the curve C.

If the variance $V_c$ exceeds a predetermined maximum variance $V_{max}$, the blade 40 may be considered improperly mounted on the spindle 30. Likewise, if the deviation $D_c$ of the curve C exceeds a predetermined maximum deviation $D_{max}$, this can be taken as an indication that the blade 40 is likely improperly mounted on the spindle 30. The maximum permitted variance $V_{max}$, and/or deviation $D_{max}$, may be selected to materially reduce the likelihood of inadvertent damage to the wafer 12, while permitting reasonable tolerances in the mounting hub 34, the blade 40, the spindle 30, and the fit of the blade 40 on the hub 34. In one embodiment, for example, the maximum permitted variance $V_{max}$, is about 2 µm and the maximum permitted deviation $D_{max}$ is about 1 µm.

The data from the sensor 50 may be delivered to the processor 60. The processor 60 may comprise any suitable structure which is adapted to process the signal from the sensor 50. For example, the processor 60 may comprise a computer running a program adapted to process the signal from the sensor 50. If the processor 60 determines that the variance $V_c$ as the blade rotates exceeds the maximum permitted variance $V_{max}$, or if the deviation $D_c$ exceeds the maximum permitted deviation $D_{max}$, the processor 60 may indicate an error condition. This can be communicated in any desired fashion. For example, the processor may deliver a warning signal to the operator on a display 62 connected to the processor 60. Alternatively or in addition to the output on the display 62, the warning signal may comprise an audible and/or visible alarm signal on an alarm 64 connected to the processor 60. This warning signal may be designed to get the attention of a human operator so the operator can inspect the saw 10 and intervene in its operation, if necessary. In another embodiment, the processor 60 is adapted to terminate rotation of the spindle 30 by the driver 22 if the variance $V_c$ exceeds the maximum permitted variance $V_{max}$, or if the deviation $D_c$ exceeds the predetermined maximum deviation $D_{max}$. Terminating rotation of the blade 40 in this fashion can limit or prevent damage to the wafer 12 by contact with an improperly mounted blade 40.

FIG. 4 shows an intermediate dotted curve B which schematically illustrates a blade 40 operating within acceptable operating parameters. The curve B is not a straight horizontal line representing no change at all in the distance D from the sensor 50 to the blade mounting face 42 as in curve A. However, the variance $V_B$ of the curve B is less than the maximum permitted variance $V_{max}$. Similarly, the deviation $D_B$ of the curve B is less than the maximum permitted deviation $D_{max}$. If the maximum permitted variance $V_{max}$ and/or the maximum deviation $D_{max}$ are appropriately selected, a blade 40 exhibiting a variance $V_B$ and a deviation $D_B$ as shown in curve B can be used to cut the wafer 12 with little or no inadvertent damage to the wafer 12.

FIG. 3 schematically illustrates a relationship between the position of the sensor 50 and the mounting surface 42 of the blade 40. For a given angular displacement of the blade 40 from a flush mount against the hub mounting face (35 in FIG. 2), the variation in the distance (D in FIG. 1) between the sensor 50 and the blade mounting surface 42 will depend on the location of the target area 52 of the sensor 50 on the blade mounting surface 42. If the sensor 50 is oriented to detect the distance to a target area 52 positioned adjacent the peripheral cutting edge 46 of the blade 40, the change in the distance D will be at or near its maximum for a given angular displacement of the blade 40 from a flush mount against the hub 34. If the sensor is instead oriented toward a target area 52' positioned closer to the center of the blade, the variation in the distance D between the sensor 50 and the mounting face 42 at that location will vary less for the same angular displacement of the blade 40 from a proper mounting position. If the sensor is adapted to move with the spindle 30 as the spindle rotational axis A—A moves with respect to the wafer table 14, the sensor 50 will always be oriented toward the same target area 52 on the blade mounting face 42. If, however, the sensor remains stationary as the distance between the axis A—A and the wafer table 14 is varied, the sensor target location 52 on the blade mounting face 42 will vary. If the processor monitors the relative position of the spindle 30 to the wafer table 14 over time, however, the processor can determine the radius of the sensor target area 52 from the center of the blade 40 and adjust the acceptable operating parameters accordingly. Hence, the maximum permitted variance $V_{max}$ and the maximum permitted deviation $D_{max}$ will be less for the target area 52' with a radius $R_2$ from the center of the blade 40 than they will be for the target area 52 with a larger radius $R_1$.

Dual-blade Saw

Figure 5:
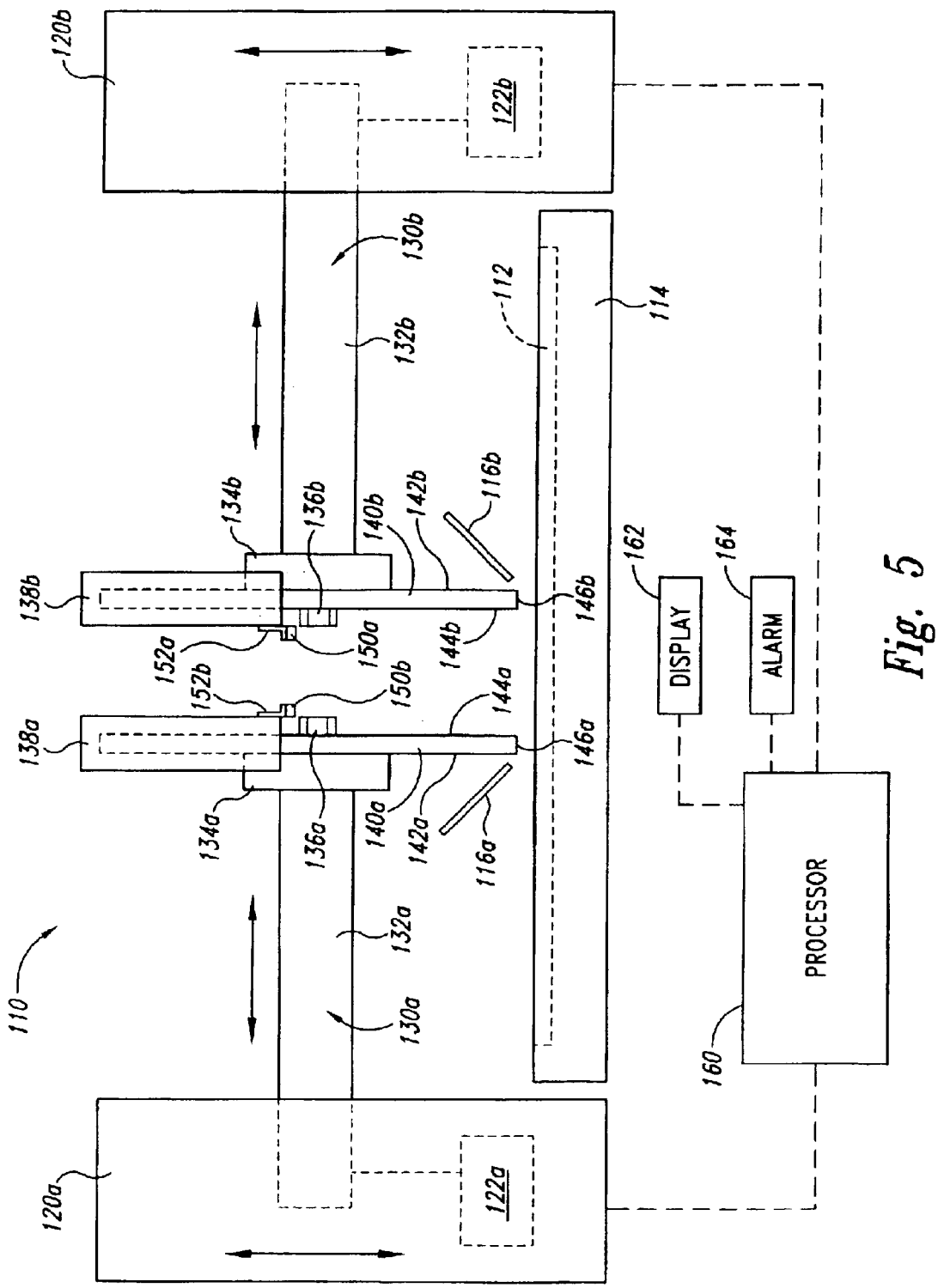
FIG. 5 is a schematic side view of a semiconductor substrate saw in accordance with an alternative embodiment of the invention.
Figure 6:
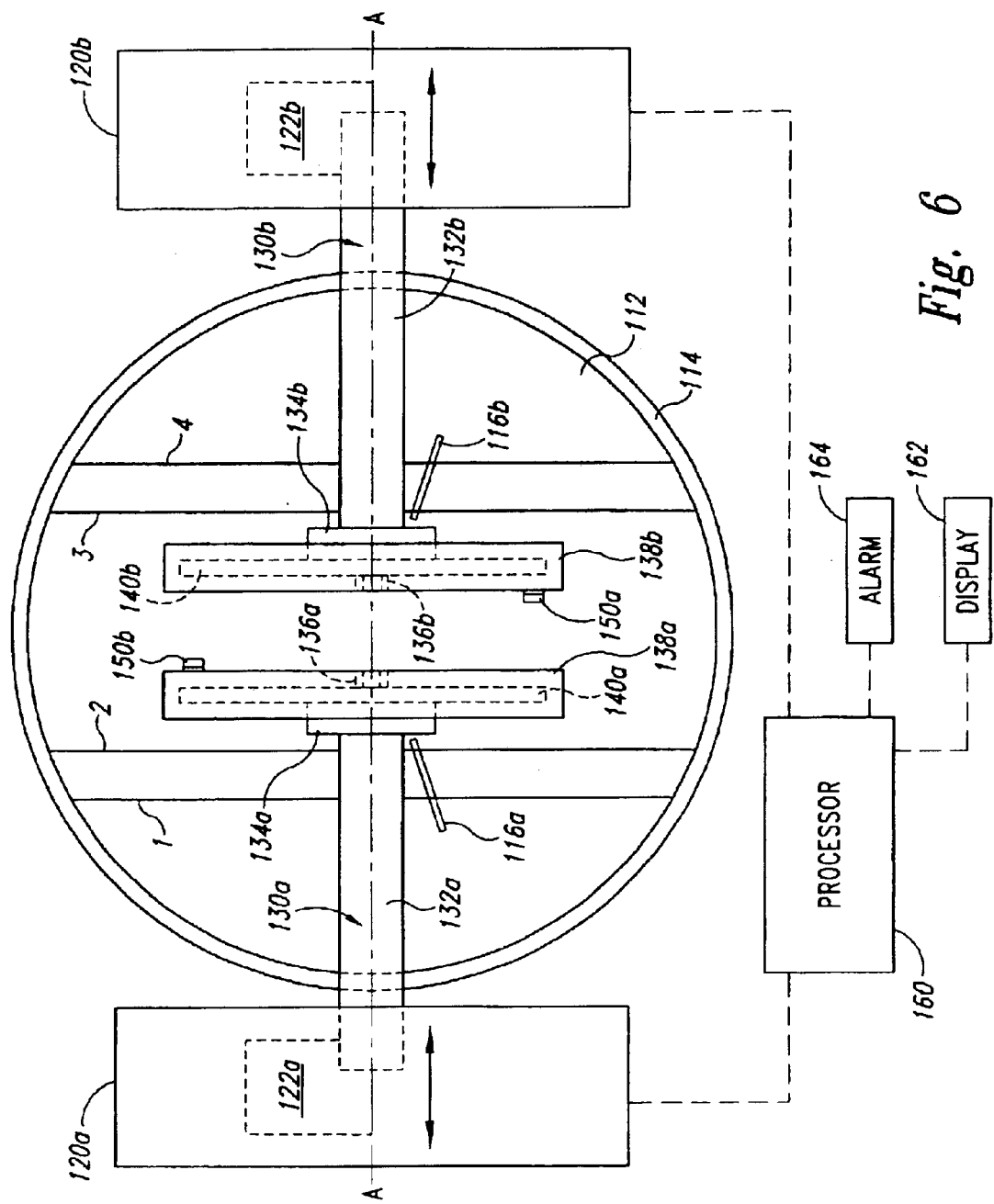
FIG. 6 is a schematic top view of the semiconductor substrate saw of FIG. 5.

FIGS. 5 and 6 schematically illustrate a twin spindle dual-blade semiconductor substrate saw 110 in accordance with an alternative embodiment of the invention. The structure and operation of this saw 110 bears significant resemblance to the structure and operation of the saw 10 shown in FIGS. 1–3. Two distinctions between these two designs are worth noting, though. First, the saw 110 of FIG. 5 has a pair of blades 140a and 140b rather than a single blade 40. Second, the sensors 150a and 150b of the saw 110 are adapted to move with respect to the supports 120a and 120b rather than being permanently affixed to the support 20.

The saw 110 of FIGS. 5 and 6 is shown as having a pair of supports 120a and 120b, each of which houses a separate driver 122a and 122b. If so desired, both of the spindles 130a and 130b may be coupled to a common driver 122 and/or supported by a common support 120. If separate drivers 122a–b are utilized, their operation can be coordinated by the processor 160.

As with the prior embodiment, a first spindle 130a may comprise a shaft 132a, a mounting hub 134a and a retaining nut 136a for mounting the first blade 140a. Similarly, a second spindle 130b may include a shaft 132b, a mounting hub 134b, and a retaining nut 136b to mount the second blade 140b.

A wafer table 114 may position a wafer 112 in proximity to the blades 140a–b so the blades 140a–b can make a cut in the wafer 112. (Four such cuts, designated by reference numerals 1–4, are schematically shown in FIG. 6.) In FIGS. 5 and 6, each of the blades 140a–b is shown as having a separate water line 116a or 116b. If desired, a single water line can be used to deliver a flow of water or other cooling liquid to both of the blades 140.

The dual-blade saw 110 of FIGS. 5 and 6 utilizes a separate sensor 150a or 150b to measure a distance to an associated one of the blades 140a or 140b, respectively. If so desired, one or both of these sensors 150a–b can be carried by the support 120a or 120b associated with the blade 140a or 140b toward which the sensor 150a or 150b, respectively, is directed. In the illustrated embodiment, however, the sensor 150a or 150b for each blade 140a or 140b is carried by the shroud 138b or 138a for the opposite blade 140b or 140a. In particular, the shroud 138a associated with the first blade 140a carries the second sensor 150b for measuring a distance to the outer face 144b of the second blade 140b. Similarly, the second shroud 138b carries the first sensor 150a for measuring a distance to the outer face 144a of the first blade 140a.

The sensors 150a–b can be mounted on their respective shrouds 138b–a in any desired fashion and in any suitable location. In the illustrated embodiment, the first sensor 150a is attached to the second shroud 138b via an L-shaped bracket 152a. This bracket 152a is positioned toward one edge of the shroud 138b and extends downwardly beyond the bottom edge of the opposite shroud 138a. This orients the first sensor 150a toward a target area adjacent a periphery of the outer face 144a of the first blade 140a. The other sensor 150b can be mounted to the other shroud 138a using a similar L-shaped bracket 152b. To avoid any interference between the two sensors 150a–b, the second sensor 150b may be positioned on the opposite side of the shared rotational axis A—A of the spindles 130a–b (see FIG. 6).

As the saw 110 is operated, it may be desirable to alter the distance between the first blade 140a and the second blade 140b to properly align the blades 140 along separate streets on the wafer. This distance can be varied by moving one or both of the spindles transversely along their coincident axes. The sensors 150a–b are carried on shrouds 138a–b which are, in turn, carried by the spindles 130a–b. Accordingly, as the spindles 130 move to alter the distance between the blades 140, the distance from the sensors 150a–b to their respective blades 140a–b will be altered, as well.

Data from both of the sensors 150a–b can be delivered to a common processor 160. Aspects of performance of the blades 140a–b can be displayed on the display 162. If the distances measured by the sensors 150a–b fall outside of acceptable operating parameters, a warning signal can be delivered to the operator via an alarm 164. Instead of or in addition to delivering such a warning signal to the alarm 164, the processor 160 may terminate rotation of one or both of the spindles 130a–b. In one embodiment, the processor 160 terminates rotation only of the spindle 130a or 130b carrying the blade 140a or 140b which falls outside of acceptable operating parameters. In an alternative embodiment, the processor 160 terminates rotation of both spindles 130a–b if the data from the sensors 150a–b indicates that either one of the blades 140a–b is operating outside of acceptable operation parameters.

Methods of Operation

The present invention provides a variety of methods for utilizing a semiconductor substrate saw. For purposes of illustration, reference is made in the following discussion to the saw 110 shown in FIGS. 5 and 6. It should be understood, though, that this is intended solely to aid in understanding the methods and that methods of the invention may be carried out using devices which differ materially from the saw 110 of FIGS. 5 and 6.

One or both of the blades 140a–b will be replaced with a new blade as they near the end of their useful life. Often, both of the blades 140a–b will be replaced at the same time, but it may be necessary to replace one of the blades, such as one of the blades is damaged. To replace the first blade 140a, the retaining nut 136a may be loosened and the shroud 138 may be lifted out of the way. The user may then slide the used first blade 140a off the spindle 130a. A new first blade 140a may be positioned on the spindle 130a, the retaining nut 136a may be tightened to hold the new first blade 140a on the spindle 136a, and the shroud 138a may be placed back in its original position about an outer peripheral portion of the first blade 140a. The second blade 140b may be replaced in much the same fashion.

Once the new blade 140 is mounted on its spindle 130, the shaft 132 of the spindle 130 may be rotated. In one embodiment, both of the shafts 132a–b are rotated at the same time even if only one of the blades 140a–b has been replaced. As the blades 140a–b are rotated, the distance from the sensor 150a to the outer face 144a of the first blade 140a may be monitored and the distance from the second sensor 150b to the outer face 144b of the second blade 140b may be monitored. The processor 160 may receive data from the sensors 150a–b and determine the variance and/or deviation for each of the blades 140a–b generally as outlined above in connection with FIG. 4. If the variance and/or deviation of either of the blades 140a–b exceeds the predetermined maximum value $V_{max}$ or $D_{max}$, respectively the processor 160 may indicate an error on the display 162 or via the alarm 164. Alternatively or in addition to indicating such an error, the processor 160 may terminate rotation of one or both of the blades 140a–b.

The blades 140a–b may be replaced with the spindles 130a–b spaced sufficiently above the wafer table 114 to space the peripheral cutting edges 146a–b of the blades 140a–b above the surface of any wafer 112 in the wafer table 114. In one embodiment, the blades 140a–b are rotated with the spindles 130a–b in these elevated positions and before the newly mounted blade(s) are lowered into contact with a wafer 112. This will help identify any problems with the mounting of the blades 140a–b before an improperly mounted blade 140a–b is allowed to damage the wafer 112. In one adaptation of this method, the first and second blades 140a–b are lowered into contact with the wafer 112 only if the blades 140a–b are operating within acceptable parameters and the processor 160 does not indicate any error. Rather than leaving this function entirely to the processor 160, the processor 160 may simply indicate any error to an operator and the operator can determine whether to lower the blades 140a–b into cutting contact with the wafer 112.

In cutting the wafer 112, the peripheral cutting edges 146a–b of both of the rotating blades 140a–b can be brought into contact with a surface of the wafer 112. By controlling the distance of the spindles 130a–b from the wafer table 114, the depth of the cuts by the blades 140a–b can be controlled. In some circumstances it may be desirable to cut only partially through the wafer 112 rather than through its entire thickness. After the partial cut has been made, the wafer 112 may be broken along the kerfs left by the blades 140a–b.

Depending on the nature of the sensors 150, an undue amount of fluid on the outer faces 144 of the blades 140 may interfere with precise measurement of the distance to the blade outer face 144. Hence, in one embodiment, the new blades 140a and 140b are rotated and the distance is monitored using the sensors 150 before the blades 140 are brought into contact with a flow of water or other cooling liquid from the water lines 116a–b.

It may be desirable to check the status of the blades 140a–b from time to time to ensure that they remain properly mounted on their respective spindles 130a–b. It may be possible to monitor the distance from each sensor 150a–b to its associated blade 140a–b while the blade is used to cut a wafer 112. In an embodiment of the invention, however, the processor will indicate an error and/or terminate rotation of the blades only when the blades are not cutting a wafer 112. In accordance with one specific embodiment, the spindles 130a–b are moved away from the wafer table 114 to space the peripheral cutting edges 146 of the blades 140 from the wafer 112. The spindles 130 may be returned to the same position with respect to the wafer table 114 they occupied when the new blades 140 were installed on the spindles 130. In an alternative embodiment, the blades 140 may be mounted on their respective spindles 130 at a first elevation and the proper mounting of the blades 140 on the spindles 130 may be confirmed before the spindles are lowered toward the wafer 112. The later confirmation that the blades 140 remain properly mounted can be performed at a different elevation, such as at a position closer to the wafer table 114. In one embodiment, the blades 140 are spaced sufficiently from the wafer table 114 and the water lines 116 to ensure that the blades are not in contact with a continuous flow of the cooling liquid. At this elevation, the spindles 130 may be rotated and the distance from each of the sensors 150a–b to their respective blades 140a–b can be monitored.

The processor 160 may preclude lowering the blades 140 back into contact with the wafer 112 if the second mounting check finds that the measured distances to the blades 140 no longer fall within acceptable operating parameters. It may be possible to perform a second check after making a first series of cuts in the wafer 112 without interfering with normal operation of the saw 110. For example, it is common practice in the industry to check the cuts or kerfs (1–4 in FIG. 6) already formed in the wafer 112 from time to time to ensure that the wafer 112 is being diced properly. The interim, post-cutting measurement of the blade mounting using the sensors 150 can be performed during such a routine lull in cutting.

In one embodiment of the invention, both of the blades 140 are returned to a specific, pre-defined location each time the mounting of the blades 140 is to be checked with the sensors 150. Returning to a specific location each time is not required, though. The variance and deviation measurements help identify irregularities in the motion of the blade as it rotates and these measurements are independent of the actual baseline distance ($D_{avg}$ in FIG. 4). As a consequence, an improperly mounted blade can be identified even if the baseline distance $D_{avg}$ between a sensor 150a–b and the associated blade 140a–b differs from one measurement to the next. As a consequence, the distance between the blades 140a–b can be varied to cut along different streets on the wafer 112 and the mounting of the blades 140 can be checked without having to return the blades to a home position. In the single-blade saw 10 of FIG. 1, the mounting of the blade 40 on the spindle 30 can be checked without having to move the blade 40 to a specific location with respect to the support 20. The ability to check the mounting of the blades 140a–b or 40 without returning them to a fixed position each time eliminates additional blade movements, helping ensure more precise registration of the blades 140 or 40 with the streets on the wafer 112.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

What is claimed is:

1. A method of exchanging a blade of a semiconductor substrate saw, comprising:

removing a used blade from a blade mount carried on a shaft of the saw;

mounting a new blade on the blade mount;

prior to contacting a semiconductor substrate with the new blade, rotating the new blade;

prior to contacting the semiconductor substrate with the new blade, monitoring a distance to a face of the new blade as the blade rotates;

prior to contacting the semiconductor substrate with the new blade, determining a baseline distance to the face of the blade and determining a deviation from the baseline distance;

prior to contacting the semiconductor substrate with the new blade, indicating an error if the deviation exceeds a predetermined maximum deviation; and, only if the error is not indicated, making a cut at least partially through the semiconductor substrate with the blade.

2. A method of exchanging a blade of a multiple-blade semiconductor substrate saw which includes a used first blade and a second blade, the used first blade being carried on a first shaft for rotation with the first shaft and the second blade being carried on a second shaft for rotation with the second shaft, the method comprising:

removing the used first blade from the first blade mount;

mounting a new first blade on the first blade mount;

rotating the new first blade in a first position;

monitoring a distance from a first sensor to a face of the new first blade as the new first blade rotates in the first position, the first sensor being associated with the second shaft;

indicating whether a first variance in the monitored distance as the new first blade is rotated is greater than a predetermined maximum first variance; and, if the first variance is not greater than the maximum first variance, contacting a semiconductor substrate with the new first blade and with the second blade.

3. The method of claim 2, further comprising moving the second shaft and the first sensor laterally with respect to the first shaft, thereby changing the distance from the first sensor to the face of the new first blade.

4. The method of claim 2 further comprising terminating rotation of the blade if the first variance is greater than the predetermined maximum variance.

5. The method of claim 2 further comprising generating a warning if the first variance is greater than the predetermined maximum variance.

6. The method of claim 2 wherein the first variance is determined without contacting the blade with a flow of cooling liquid.

7. The method of claim 6 wherein the blade is contacted with a flow of cooling liquid when the blade is cutting the semiconductor substrate.

8. The method of claim 7 wherein the cooling liquid comprises water.

9. The method of claim 2 wherein the blade is rotated in the first position prior to contacting the semiconductor substrate with the blade.

10. The method of claim 2 further comprising cutting at least partially through the semiconductor substrate with the new first blade and with the second blade.

11. The method of claim 10 further comprising, after cutting the semiconductor substrate, rotating the new first blade in a second position, monitoring the distance from the first sensor to the face of the new first blade as the new first blade rotates in the second position, and indicating whether a second variance in the monitored distance as the new first blade is rotated is greater than a predetermined maximum second variance.

12. The method of claim 11 wherein the first position differs from the second position.

13. The method of claim 11 further comprising moving the second shaft and the first sensor laterally with respect to the first shaft, thereby changing the distance from the first sensor to the face of the new first blade, after monitoring the first distance and before monitoring the second distance.

14. The method of claim 2 further comprising removing the second blade from the second mount; mounting a new second blade on the second blade mount; rotating the new second blade; monitoring a distance from a second sensor to a face of the new second blade as the new second blade rotates, the second sensor being associated with the first shaft; and indicating whether a second variance in the measured distance as the new second blade is rotated in the second position is greater than a predetermined maximum second variance.

15. The method of claim 14 wherein the semiconductor substrate is contacted with the first blade and with the second blade only if the first variance is not greater than the maximum first variance and the second variance is not greater than the maximum second variance.

16. The method of claim 14 wherein the maximum first variance is equal to the maximum second variance and the semiconductor substrate is contacted with the first blade and with the second blade only if neither the first variance nor the second variance is greater than the maximum first variance.

17. A semiconductor wafer saw, comprising:
a carrier for a microelectronic workpiece;
a driver;
a shaft coupled to the driver and extending opposite the carrier, the shaft having an axis;
a blade mount carried by the shaft for rotation with the shaft;
a blade carried by the blade mount for rotation with the blade mount, the blade having a face and a peripheral cutting edge;
a sensor spaced from the blade and oriented toward the face of the blade, the sensor maintaining a fixed angular position with respect to the axis as the blade is rotated with the shaft, the sensor being adapted to measure a distance to the face of the blade; and
a processor operatively coupled to the sensor, the processor being adapted to indicate if the distance to the face of the blade deviates more than a permitted deviation from a baseline distance to the face of the blade as the blade rotates.

18. The semiconductor wafer saw of claim 17 wherein the sensor comprises a CCD laser displacement sensor.

19. The semiconductor wafer saw of claim 17 wherein the shaft is adapted to move transversely with respect to the sensor.

20. The semiconductor wafer saw of claim 17 wherein the sensor is carried by a support and the shaft is moveable vertically with respect to the support.

21. The semiconductor wafer saw of claim 20 wherein the shaft is moveable transversely with respect to the support to vary the baseline distance.

22. The semiconductor wafer saw of claim 17 wherein the shaft is moveable with respect to the sensor to vary the baseline distance.

23. The semiconductor wafer saw of claim 17 further comprising a cooling liquid supply line positioned to deliver a cooling fluid, the processor being adapted to control flow through the supply line to terminate flow of cooling fluid when the sensor monitors the distance to the face of the blade.

24. A semiconductor wafer saw, comprising:
a carrier for a microelectronic workpiece;
a first spindle extending opposite the carrier, the first spindle having a first axis;
a first blade carried by the first spindle for rotation with the first spindle, the first blade having a face and a peripheral cutting edge;
a second spindle extending opposite the carrier, the second spindle having a second axis;
a second blade carried by the second spindle for rotation with the second spindle, the second blade having a face and a peripheral cutting edge;
a first sensor carried by the second spindle and adapted to measure a first distance to the face of the first blade, the first sensor maintaining a fixed angular position with respect to the first axis as the first blade rotates about the first axis;
a second sensor carried by the first spindle and adapted to measure a second distance to the face of the second blade, the second sensor maintaining a fixed angular position with respect to the second axis as the second blade rotates about the second axis; and
a processor operatively coupled to the first and second sensors, the processor being adapted to indicate if variation of the first distance as the first blade rotates exceeds a predetermined maximum first variation and to indicate if variation of the second distance as the second blade rotates exceeds a predetermined maximum second variation.

25. The semiconductor wafer saw of claim 24 wherein the first axis coincides with the second axis.

26. The semiconductor wafer saw of claim 25 wherein one or both of the first and second spindles are adapted for movement transversely along the coincident first and second axes.

27. The semiconductor wafer saw of claim 24 wherein the first spindle is adapted for movement transversely along the first axis, movement of the first spindle along the first axis varying a baseline distance of the first sensor from the face of the first blade.

28. The semiconductor wafer saw of claim 27 wherein the second spindle is adapted for movement transversely along the second axis.

29. The semiconductor wafer saw of claim 24 wherein the second spindle is adapted for movement transversely along the second axis, movement of the second spindle along the second axis varying a baseline distance of the second sensor from the face of the second blade.

30. The semiconductor wafer saw of claim 24 wherein the first spindle is adapted for movement transversely along the first axis and the second spindle is adapted for movement transversely along the second axis.

31. The semiconductor wafer saw of claim 24 wherein the first sensor comprises a CCD laser displacement sensor.

32. The semiconductor wafer saw of claim 24 wherein the second sensor comprises a CCD laser displacement sensor.

33. The semiconductor wafer saw of claim 24 wherein the first and second spindles are each moveable vertically with respect to the carrier.

34. The semiconductor wafer saw of claim 24 further comprising a cooling liquid supply line positioned to deliver a cooling fluid, the processor being adapted to control flow through the supply line to terminate flow of cooling fluid when the sensor monitors a the distance to the face of the first blade.

35. The semiconductor wafer saw of claim 17 wherein the shaft is a first shaft, the axis is a first axis, the blade mount is a first blade mount, and the blade is a first blade, further comprising:

a second shaft extending opposite the carrier;

a second blade mount carried by the second shaft for rotation with the second shaft; and a second blade carried by the second blade mount for rotation with the second blade mount, the second blade having a face and a peripheral cutting edge.

36. The semiconductor wafer saw of claim 35 wherein the sensor is a first sensor, the permitted deviation is a first permitted deviation, and the baseline distance is a first baseline distance, further comprising a second sensor that is operatively coupled to the processor and is adapted to measure a distance to the face of the second blade, the processor being adapted to indicate if the distance to the face of the second blade deviates more than a second permitted deviation from a second baseline distance to the face of the second blade as the second blade rotates.

* * * * *